United States Patent
Ichikawa et al.

(10) Patent No.: US 11,612,085 B2
(45) Date of Patent: Mar. 21, 2023

(54) VEHICULAR DISPLAY DEVICE

(71) Applicant: Yazaki Corporation, Tokyo (JP)

(72) Inventors: Junichi Ichikawa, Shizuoka (JP); Tetsuya Sugiyama, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 70 days.

(21) Appl. No.: 17/191,728

(22) Filed: Mar. 4, 2021

(65) Prior Publication Data
US 2021/0289672 A1 Sep. 16, 2021

(30) Foreign Application Priority Data

Mar. 10, 2020 (JP) .............................. JP2020-040538

(51) Int. Cl.
*H05K 7/20* (2006.01)
*B60K 35/00* (2006.01)

(52) U.S. Cl.
CPC ......... *H05K 7/20972* (2013.01); *B60K 35/00* (2013.01); *B60K 2370/1529* (2019.05); *B60K 2370/23* (2019.05)

(58) Field of Classification Search
CPC ................ H05K 7/20972; B60K 35/00; B60K 2370/23; B60K 2370/1529; G02B 27/0101
USPC ....................................................... 348/837
See application file for complete search history.

(56) References Cited

U.S. PATENT DOCUMENTS

| 2015/0092118 | A1* | 4/2015 | Hada ................... B60K 35/00 349/11 |
| 2018/0341110 | A1* | 11/2018 | Hirata .................. G02B 27/286 |
| 2019/0047418 | A1 | 2/2019 | Yoshimura et al. |
| 2019/0235245 | A1* | 8/2019 | Kato ...................... G02B 7/008 |
| 2020/0116999 | A1 | 4/2020 | Watanabe et al. |

FOREIGN PATENT DOCUMENTS

| CN | 108495764 A | 9/2018 |
| CN | 110770635 A | 2/2020 |
| JP | 2017-173557 A | 9/2017 |

\* cited by examiner

*Primary Examiner* — Thai Q Tran
*Assistant Examiner* — Nienru Yang
(74) *Attorney, Agent, or Firm* — Kenealy Vaidya LLP

(57) ABSTRACT

A vehicular display device includes: an emitting portion; a reflection portion configured to reflect the display light that is emitted from the emitting portion and is subjected to crossing, to a display surface such that the display light is reflected from the display surface to a previously defined eye point; and a casing including: an inner case; and a lower case housing the inner case inside, in which the inner case includes an inner wall part facing a focal area on which external light reflected from the reflection portion after being incident on the reflection portion from outside the casing focuses, the lower case includes a lower wall part located along the inner wall part, and the casing has a heat-discharge structure of conducting heat from the inner wall part to the lower wall part to discharge the heat outward.

17 Claims, 6 Drawing Sheets

VEHICULAR DISPLAY DEVICE

CROSS-REFERENCE TO RELATED APPLICATION(S)

The present application claims priority to and incorporates by reference the entire contents of Japanese Patent Application No. 2020-040538 filed in Japan on Mar. 10, 2020.

BACKGROUND OF THE INVENTION

1. Field of the Invention

The present invention relates to a vehicular display device.

2. Description of the Related Art

As an exemplary conventional vehicular display device to be applied to a vehicle, Japanese Patent Application Laid-open No. 2017-173557 discloses a head-up display device. The head-up display device includes: a display device that emits display light; a first mirror that reflects the display light emitted from the display device; a second mirror that reflects the display light reflected from the first mirror; and a case housing the display device, the first mirror, and the second mirror. The first mirror is a first concave mirror having a curvature that causes, before the reflected display light reaches the second mirror, vertical crossing in the reflected display light. The second mirror is a second concave mirror that reflects the received display light. The case includes: a first shield and a second shield extending to the vicinity of the cross point at which the crossing occurs such that the optical path between the first concave mirror and the second concave mirror is interposed between the first shield and the second shield; and a transmissive member that transmits visible light and reflects infrared rays, at an opening for the optical path between the first light-shield and the second light-shield.

Such a head-up display device as described above has, for example, room for further improvement of inhibition of thermal degradation.

SUMMARY OF THE INVENTION

The present invention has been made in consideration of the situation, and an object of the present invention is to provide a vehicular display device enabling inhibition of thermal degradation.

In order to achieve the above mentioned object, a vehicular display device according to one aspect of the present invention includes an emitting portion equipped in a vehicle, the emitting portion being configured to emit display light; a reflection portion configured to reflect the display light that is emitted from the emitting portion and is subjected to crossing in a direction intersecting an optical-axis direction, to a display surface provided at the vehicle such that the display light is reflected from the display surface to a previously defined eye point; and a casing including an inner case inside which a cross point for the display light is located and a lower case housing the inner case inside, wherein the inner case includes an inner wall part facing a focal area on which external light reflected from the reflection portion after being incident on the reflection portion from outside the casing focuses, the lower case includes a lower wall part located along the inner wall part, and the casing has a heat-discharge structure of conducting heat from the inner wall part to the lower wall part to discharge the heat outward.

According to another aspect of the present invention, in the vehicular display device, it is possible to configure that the heat-discharge structure includes a heat-transfer sheet that is interposed between the inner wall part and the lower wall part in contact with the inner wall part and the lower wall part and conducts the heat from the inner wall part to the lower wall part.

According to still another aspect of the present invention, in the vehicular display device, it is possible to configure that the heat-discharge structure includes an integrally coupled portion including the inner wall part and the lower wall part integrally coupled together.

According to still another aspect of the present invention, in the vehicular display device, it is possible to configure that the heat-discharge structure includes a Peltier element that is interposed between the inner wall part and the lower wall part in contact with the inner wall part and the lower wall part and achieves Peltier effect due to application of a direct current.

According to still another aspect of the present invention, in the vehicular display device, it is possible to configure that the heat-discharge structure includes a heat sink portion that is provided on an outer-wall surface of the lower wall part and dissipates the heat conducted from the inner wall part to the lower wall part, outward.

According to still another aspect of the present invention, in the vehicular display device, it is possible to further include that a forced air cooling portion configured to forcibly cool the heat sink portion with cooling air.

According to still another aspect of the present invention, in the vehicular display device, it is possible to further include that a temperature detector configured to detect a temperature of the inner wall part; and a controller configured to control drive of the forced air cooling portion, based on the temperature of the inner wall part detected by the temperature detector, wherein the controller brings, in a case where the temperature of the inner wall part detected by the temperature detector is a previously set temperature threshold or more, the forced air cooling portion into a driving state and brings, in a case where the temperature of the inner wall part detected by the temperature detector is less than the temperature threshold, the forced air cooling portion into a stopped state.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments according to the present invention will be described in detail below on the basis of the drawings. It should be noted that the invention is not limited to the embodiments. The constituent elements in the following embodiments include constituent elements that persons skilled in the art can replace easily and substantially the same constituent elements.

First Embodiment

Figure 1:
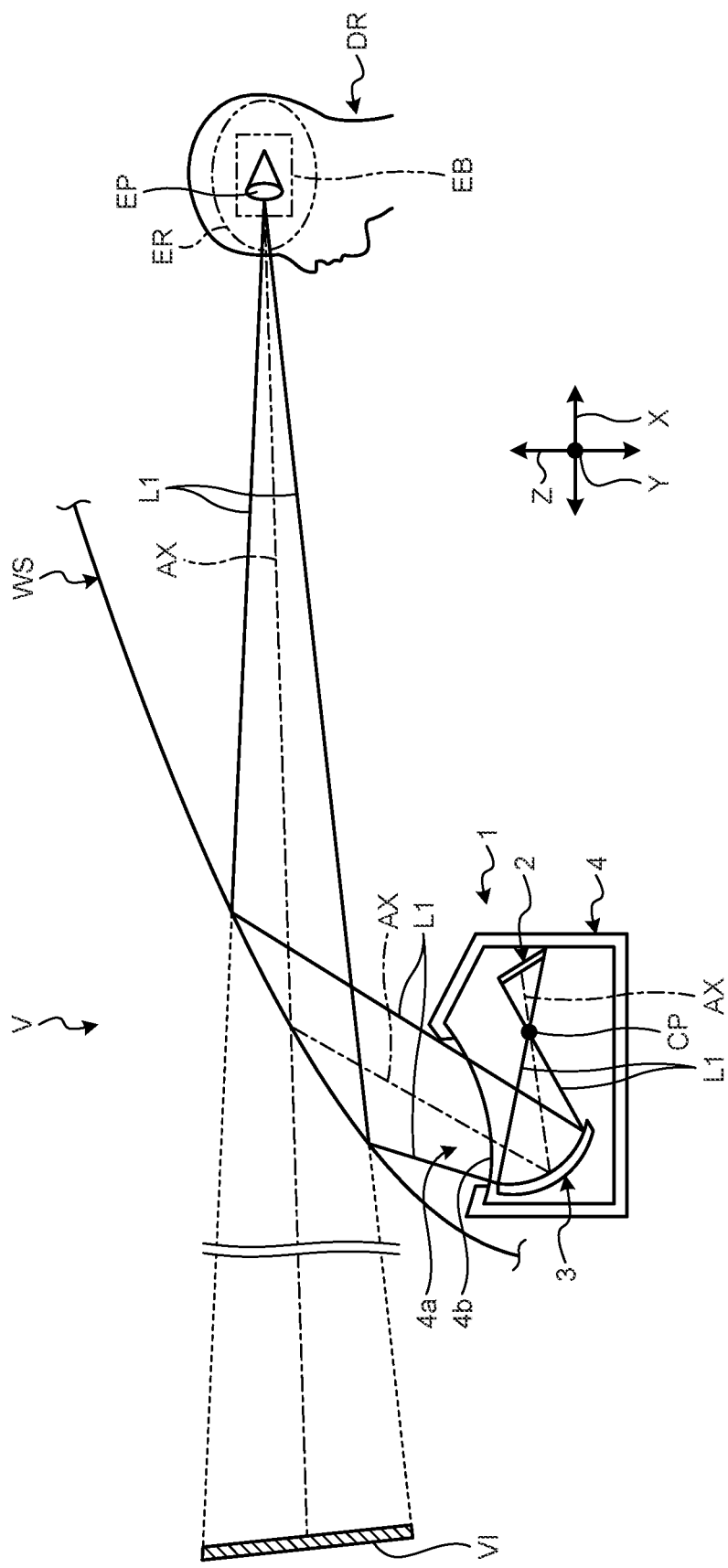
FIG. 1 is a schematic sectional view of a schematic configuration of a vehicular display device according to a first embodiment.
Figure 2:
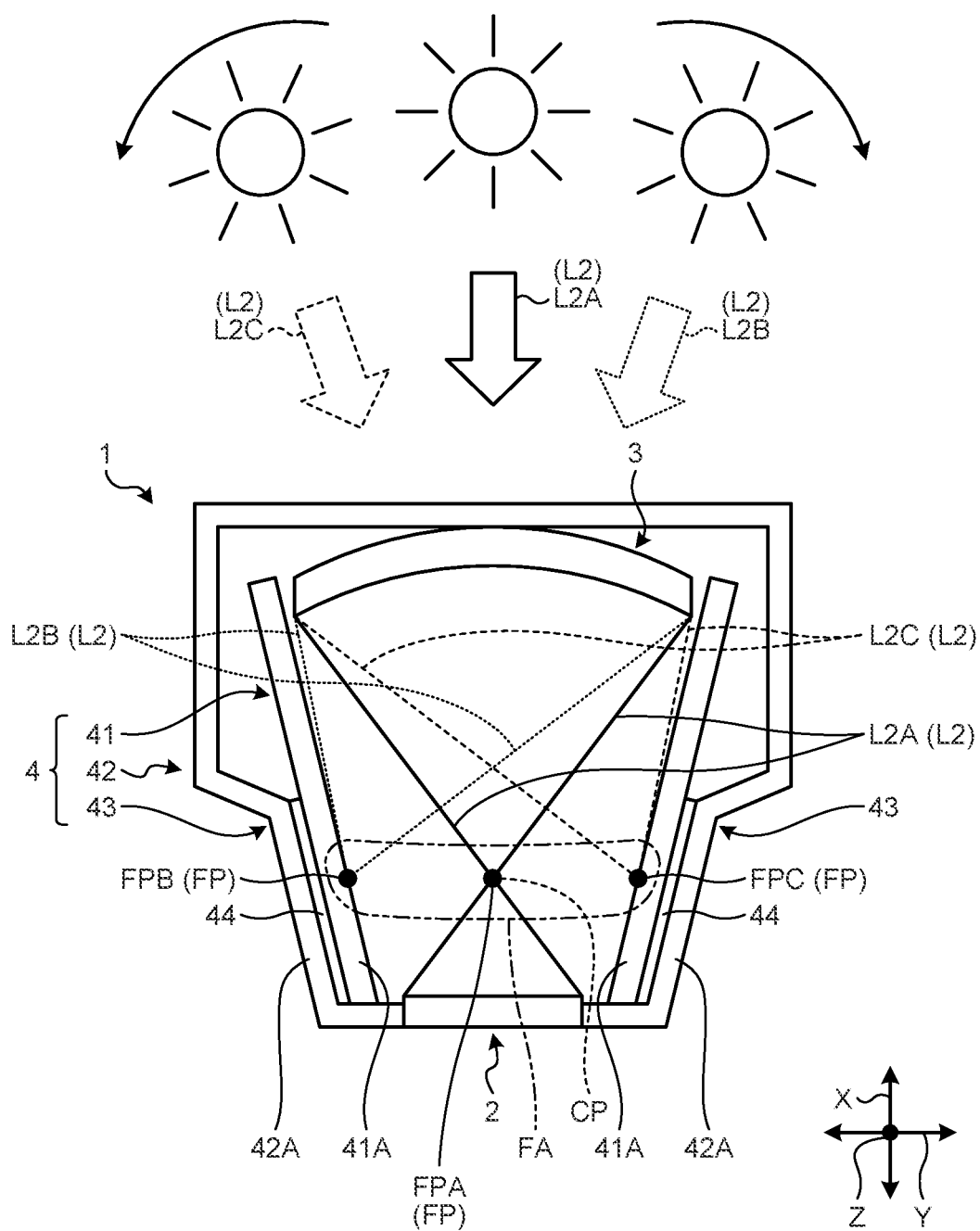
FIG. 2 is a schematic sectional view of a schematic configuration of the vehicular display device according to the first embodiment.

A vehicular display device 1 according to the present embodiment illustrated in FIGS. 1 and 2 is applied to a vehicle V, serving as a so-called head up display (HUD). The vehicular display device 1 is, for example, equipped in an instrument panel provided at the dashboard of the vehicle V. The vehicular display device 1 emits display light L1 to, for example, windshield WS of the vehicle V such that a display image VI is reflected from the windshield WS to an eye point EP, resulting in presentation of various types of visible information to a driver DR or the like. With the display image VI projected on the windshield WS, the vehicular display device 1 displays vehicular information regarding the vehicle V, visually at the eye point EP.

Here, typically, the eye point EP is defined in advance to be located in an eye box EB set in a so-called eye range ER in the vehicle V. The eye range ER is the "driver's eye range of an automobile" and corresponds to a region in which the point of view of the driver DR determined in advance in accordance with the vehicle V is located. Typically, the eye range ER statistically indicates the distribution of positions of the eyes of the driver DR in the vehicle V. For example, the eye range ER corresponds to a region including a predetermined percentage (e.g., 95%) of positions of the eyes of the driver DR while the driver DR is sitting in the driver's seat. The eye box EB is defined in advance to be located in the eye range ER and as a spatial region in which the driver DR sitting in the driver's seat can visually identify the display image VI properly while driving.

In the vehicle V, the windshield WS serves as a display surface that reflects the display light L1 emitted from the vehicular display device 1 to the eye point EP. The windshield WS is a transmissive member having light transmissivity that transmits at least light having visible-light components (rays of visible light). Here, the light having visible-light components is light having wavelength components in a visible-light region that people can visually identify, and is, for example, light having wavelength components in the range of 360 to 830 nm.

The vehicular display device 1 according to the present embodiment causes, in the display light L1, crossing in the direction intersecting the optical-axis direction along an optical axis AX in the optical path of the display light L1, so that a casing 4 is rendered compact. On the other hand, the vehicular display device 1 according to the present embodiment removes, through a heat-discharge structure 43, condensing heat that may occur due to external light L2 (particularly, refer to FIG. 2), resulting in inhibition of thermal degradation of the casing 4 or the like. The configuration of the vehicular display device 1 will be described in detail below with reference to each figure.

It should be noted that, in the following description, for the vehicle V to which the vehicular display device 1 is applied, the "vehicular forward and backward direction X" typically corresponds to the full-length direction of the vehicle V, more specifically, corresponds to the straight forward and backward direction of the vehicle V. The "vehicular width direction Y" typically corresponds to the full-width direction of the vehicle V, namely, corresponds to the lateral direction of the vehicle V. The "vehicular height direction Z" typically corresponds to the height direction of the vehicle V. The vehicular forward and backward direction X as a first direction, the vehicular width direction Y as a second direction, and the vehicular height direction Z as a third direction are mutually orthogonal. With the vehicle V located on a horizontal surface, the vehicular forward and backward direction X and the vehicular width direction Y are parallel to the horizontal direction, and the vehicular height direction Z is parallel to the vertical direction. In the following description, in the vehicular forward and backward direction X, the side on which the vehicle V travels forward is referred to as the "front side" and the side on which the vehicle V travels backward is referred to as the "back side", in some cases. In the vehicular width direction Y, the left side on the front side in the vehicular forward and backward direction X is referred to as the "left side" and the right side on the front side in the vehicular forward and backward direction X is referred to as the "right side", in some cases. In the vehicular height direction Z, the upper side in the vertical direction is referred to as the "upper side" and the lower side in the vertical direction is referred to as the "lower side", in some cases. Unless otherwise noted, each direction used in the following description indicates the direction of each part mutually assembled.

Specifically, the vehicular display device 1 according to the present embodiment is disposed between the windshield WS and the eye point EP in the vehicular forward and backward direction X and is disposed on the lower side in the vertical direction of the windshield WS (particularly, refer to FIG. 1). The vehicular display device 1 emits the display light L1 to the windshield WS serving as the display surface and displays, on the windshield WS, the display image VI due to the display light L1 reflected from the windshield WS to the eye point EP, so that the vehicular information regarding the vehicle V is displayed. The vehicular information that the vehicular display device 1 displays may include, for example, vehicular speed, the number of output revolutions of the power source for traveling, accumulated travel distance, the temperature of coolant, the amount of remaining fuel, the amount of stored electricity in the battery, various types of warning lamps, the position of the gearshift, the direction that the directional indicator indicates, and navigation information. In addition, the vehicular information that the vehicular display device 1 displays may include, for example, caution-target information regarding the periphery of the vehicle V (e.g., information regarding pedestrians, peripheral vehicles, obstructions, goods, and the like) that is displayed in superimposition on the background viewed from the eye point EP through the windshield WS.

More specifically, the vehicular display device 1 includes an emitting portion 2, a reflection portion 3, and the casing 4. The vehicular display device 1 is unified with each part, such as the emitting portion 2 and the reflection portion 3, housed inside the casing 4, and is disposed on the lower side in the vertical direction of the windshield WS as described above. The vehicular display device 1 emits the display light L1 emitted from the emitting portion 2, to the windshield WS through an optical component such as the reflection portion 3 such that the display light L1 is reflected from the windshield WS to the eye point EP, so that the display image VI is displayed on the windshield WS.

The emitting portion 2 is a display device that is equipped in the vehicle V and is capable of emitting the display light L1. The emitting portion 2 is provided inside the casing 4. The display light L1 that the emitting portion 2 emits achieves the display image VI that is displayed on the windshield WS, and includes at least light having visible-light components. Examples of a device that emits the display light L1 as the emitting portion 2 include a laser projector, a thin liquid-crystal display, a plasma display, an organic EL display, an optical indicator, and a fluorescent display. Herein, the emitting portion 2 is provided on the back side in the vehicular forward and backward direction X inside the casing 4. The emitting portion 2 is supported inside the casing 4 such that the optical-axis direction of the display light L1 that the emitting portion 2 emits (direction along the optical axis AX) is oriented to the front side in the vehicular forward and backward direction X. The emitting portion 2 emits (projects) the display light L1 to the front side in the vehicular forward and backward direction X.

The reflection portion 3 is an optical element serving as an optical-path changing optical component that changes the optical path of the display light L1 emitted from the emitting portion 2. The reflection portion 3 totally reflects the display light L1 emitted from the emitting portion 2, to the windshield WS such that the display light L1 is reflected from the windshield WS to the eye point EP. The reflection portion 3 may be a so-called plane mirror, a magnifying mirror, or a free-form mirror. The magnifying mirror is formed as a concave or convex mirror, and magnifies and reflects the image due to the display light L1 such that the image due to the display light L1 after reflection is relatively larger than the image due to the display light L1 before reflection. Unlike spherical and parabolic mirrors, the free-form mirror is formed as a mirror asymmetric about the optical axis AX and is also referred to as an aspheric mirror. That is, the free-form mirror is formed as a concave or convex mirror asymmetric about the optical axis AX. The free-form mirror is formed in a shape corresponding to, for example, the surface shape of the windshield WS and the geometric positional relationship between optical-reflection components, such as the reflection portion 3 and the windshield WS. The free-form mirror reflects the display light L1 with correction of optical distortion such that the display image VI due to the display light L1 finally projected on the windshield WS has a desired shape. Herein, the reflection portion 3 is exemplarily illustrated to serve as a free-form mirror (aspheric mirror) but is not limited to this.

The reflection portion 3 is provided inside the casing 4. Herein, inside the casing 4, the reflection portion 3 is provided on the front side in the vehicular forward and backward direction X, opposing to the emitting portion 2 in the vehicular forward and backward direction X. The reflection portion 3 is supported inside the casing 4 such that the optical-axis direction of the display light (reflected light) L1 reflected by the reflection portion 3 is oriented to slightly the back side in the vehicular forward and backward direction X and to substantially the immediately upper side in the vehicular height direction Z. The reflection portion 3 reflects the display light L1 to slightly the back side in the vehicular forward and backward direction X and to substantially the immediately upper side in the vehicular height direction Z.

Here, the reflection portion 3 according to the present embodiment serves as an optical component that reflects, to the windshield WS, the display light L1 that is emitted from the emitting portion 2 and is subjected to crossing in the direction intersecting the optical-axis direction (direction along the optical axis AX). That is, the vehicular display device 1 according to the present embodiment has a cross point CP for the display light L1 in the optical path between the emitting portion 2 and the reflection portion 3, so that crossing in the direction intersecting the optical-axis direction is caused in the display light L1 at the cross point CP.

Before the display light L1 emitted from the emitting portion 2 reaches the reflection portion 3, the vehicular display device 1 according to the present embodiment causes, in the display light L1, crossing in the vehicular width direction Y and the vehicular height direction Z as the direction intersecting the optical-axis direction. For example, the vehicular display device 1 may cause crossing in the display light L1 with adjustment of an optical component, such as a lens, inside the device serving as the emitting portion 2 or may cause crossing in the display light L1 through additional optical components, such as a lens and a mirror, outside the device serving as the emitting portion 2. The cross point CP for the display light L1 corresponds to the focal point at which the display light L1 emitted from the emitting portion 2 converges between the emitting portion 2 and the reflection portion 3. The position of the cross point CP for the display light L1 is determined in accordance with the optical design of each optical component.

As above, the vehicular display device 1 has the cross point CP at which crossing occurs in the display light L1, in the optical path between the emitting portion 2 and the reflection portion 3, so that the width of the optical path can be made relatively narrow in the vicinity of the cross point CP. As a result, the vehicular display device 1 can be rendered compact.

It should be noted that, as described above, the reflection portion 3 according to the present embodiment is illustrated as one free-form mirror but is not limited to this. Thus, the reflection portion 3 may include a plurality of intermediate mirrors. The vehicular display device 1 is required at least to have each optical component disposed such that at least one cross point CP is present between the emitting portion 2 and the backmost mirror included in the reflection portion 3.

The casing 4 houses the emitting portion 2, the reflection portion 3, and the like, inside. For example, the casing 4 is formed of an insulating synthetic resin. For example, the casing 4 is hollow boxy due to a combination of a plurality of members including an inner case 41 and a lower case 42, to be described later, and houses the emitting portion 2, the reflection portion 3, and the like in the hollow internal space. In addition, the casing 4 houses, for example, a control circuit board that controls the operation of each part in the vehicular display device 1, inside.

The casing 4 has an optical-path opening 4a on the upper face in the vehicular height direction Z. The optical-path opening 4a allows communication between inside and outside the casing 4. The optical-path opening 4a allows the display light L1 emitted from the emitting portion 2 to exit outside the casing 4. The optical-path opening 4a allows the display light L1 to exit outside the casing 4 such that the display light L1 travels from inside the casing 4 to the windshield WS. Herein, the casing 4 has the optical-path opening 4a facing the upper side in the vehicular height direction Z and has a transparent covering member 4b covering the optical-path opening 4a. The transparent covering member 4b is an optically transmissive member that transmits at least the display light L1 emitted from the emitting portion 2. The casing 4 in positional relationship with the optical-path opening 4a facing the upper side in the vehicular height direction Z is provided in the instrument panel.

In the vehicular display device 1 as above, the display light L1 corresponding to information to be displayed, emitted from the emitting portion 2, is projected onto the reflection portion 3 through the cross point CP. Then, the reflection portion 3 in the vehicular display device 1 reflects the display light L1 to the windshield WS serving as the display surface. The vehicular display device 1 causes the display light L1 reflected from the reflection portion 3 to the windshield WS, to reach the windshield WS through the optical-path opening 4a and the transparent covering member 4b. Then, the display light L1 having reached the windshield WS from the vehicular display device 1 is reflected from the windshield WS to the eye point EP. Due to this configuration, the vehicular display device 1 displays, on the windshield WS, the display image VI due to the display light L1. The display image VI is a reflected image due to the display light L1 reflected from the windshield WS to the eye point EP and is a so-called virtual image that can be visually identified from the eye point EP. In this manner, with the display light L1, the vehicular display device 1 can virtually display the display image VI regarding the vehicular information, on the windshield WS.

Due to such a configuration, the casing 4 according to the present embodiment includes at least the inner case 41 and the lower case 42 as illustrated in FIG. 2. The casing 4 according to the present embodiment can be rendered compact because the width of the optical path of the display light L1 (refer to FIG. 1) is made relatively narrow in the vicinity of the cross point CP for the display light L1 (refer to FIG. 1) as above.

The inner case 41 is boxy and has a hollow internal space, so that the optical path of the display light L1 and the cross point CP for the display light L1 are located in the hollow internal space. The inner case 41 has an opening or a notch serving as the optical-path opening 4a, at a portion corresponding to at least the optical-path opening 4a.

The inner case 41 according to the present embodiment includes an inner wall part 41A facing at least a focal area FA.

Here, the focal area FA is a region in which a focal point FP is present. The focal point FP is a point on which the external light L2, such as sunlight, reflected from the reflection portion 3 after being incident on the reflection portion 3 from outside the casing 4 through the optical-path opening 4a (refer to FIG. 1) focuses, and is a site on which relatively high thermal energy acts. The position of the focal point FP varies, for example, in accordance with a variation in the incident angle of the external light L2 to the reflection portion 3.

For example, in a case where external light (sunlight) L2A (indicated with a solid line) is incident on the reflection portion 3 from the sun at the central position in FIG. 2, a focal point FPA is located at substantially the center in the vehicular width direction Y inside the inner case 41. In a case where external light (sunlight) L2B (indicated with a dotted line) is incident on the reflection portion 3 from the sun at the right position to the central position in FIG. 2, a focal point FPB is located on the inner wall part 41A on the left side in the vehicular width direction Y. Meanwhile, in a case where external light (sunlight) L2C (indicated with a dashed line) is incident on the reflection portion 3 from the sun at the left position to the central position in FIG. 2, a focal point FPC is located on the inner wall part 41A on the right side in the vehicular width direction Y.

The focal area FA is a region in which the focal points FP that vary in position in accordance with the incident angle of the external light L2 as above collect, in other words, a region in which the focal point FP is located in accordance with the incident angle of the external light L2. Because of the optical design of the vehicular display device 1, each focal point FP (focal points FPA, FPB, and FPC) is typically located in the vicinity of the cross point CP for the display light L1 described above. The focal area FA is present as a region including the cross point CP.

The position of the focal point FP that varies in accordance with the incident angle of the external light L2 and the focal area FA are determined, for example, in accordance with the geometric positional relationship between optical-reflection components, such as the windshield WS serving as the display surface and the reflection portion 3. Thus, the position of the focal point FP and the focal area FA can be grasped in advance, for example, by simulation.

The inner wall part 41A according to the present embodiment serves as a wall part facing the focal area FA as above in the inner case 41. In the example of FIG. 2, illustrated is a pair of inner wall parts 41A opposed to each other along the vehicular width direction Y. In the inner case 41, the focal point FPB described above is located on one of the pair of inner wall parts 41A and the focal point FPC described above is located on the other inner wall part 41A. In the inner case 41, the focal point FPA and the focal area FA described above are located between the pair of inner wall parts 41A. The inner wall parts 41A each function as a light-shielding wall against the external light L2.

The pair of inner wall parts 41A according to the present embodiment extends along the vehicular forward and backward direction X and is in a formation in which the pair of inner wall parts 41A comes gradually close to the cross point CP from the front side to the back side in the vehicular forward and backward direction X such that the interval along the vehicular width direction Y gradually shortens and narrows. The vehicular display device 1 according to the present embodiment has: the reflection portion 3 disposed at the end portions on the front side in the vehicular forward and backward direction X of the pair of inner wall parts 41A; and the emitting portion 2 disposed at the end portions on the back side in the vehicular forward and backward direction X of the pair of inner wall parts 41A.

It should be noted that, as described above, in the example of FIG. 2, illustrated is the inner case 41 having the pair of inner wall parts 41A opposed to each other along the vehicular width direction Y. In addition, the inner case 41 has a pair of inner wall parts opposed to each other in the vehicular height direction Z. The inner case 41 is hollow boxy with the inner wall parts integrally formed. In the following description, as much as possible, omitted will be the pair of inner wall parts opposed to each other along the vehicular height direction Z and the configuration of the lower case 42 and the heat-discharge structure 43 related to the pair of inner wall parts that is substantially the same as the configuration of the lower case 42 and the heat-discharge structure 43 to the pair of inner wall parts 41A opposed to each other along the vehicular width direction Y.

The lower case 42 is boxy and has a hollow internal space, so that the emitting portion 2, the reflection portion 3, the inner case 41, and the like are housed in the hollow internal space. Similarly to the inner case 41, the lower case 42 has an opening or a notch serving as the optical-path opening 4a, at a portion corresponding to at least the optical-path opening 4a.

The lower case 42 according to the present embodiment includes a lower wall part 42A located at least along an inner wall part 41A. The lower wall part 42A is formed in a shape along the inner wall part 41A facing the focal area FA as above. In the example of FIG. 2, illustrated is a pair of lower wall parts 42A provided outside the pair of inner wall parts 41A in the vehicular width direction Y.

The pair of lower wall parts 42A is each opposed to the corresponding inner wall part 41A along the vehicular width direction Y and is each adjacently along the corresponding inner wall part 41A. Similarly to each inner wall part 41A, the pair of lower wall parts 42A according to the present embodiment extends along the vehicular forward and backward direction X and is in a formation in which the pair of lower wall parts 42A comes gradually close to the cross point CP from the front side to the back side in the vehicular forward and backward direction X such that the interval along the vehicular width direction Y gradually shortens and narrows. The pair of inner wall parts 41A and the pair of lower wall parts 42A are located in the vehicular forward and backward direction X such that the focal area FA is interposed between the pair of inner wall parts 41A and between the pair of lower wall parts 42A.

It should be noted that the lower case 42 includes a wall part surrounding the entirety of the emitting portion 2, the reflection portion 3, the inner case 41, and the like, in addition to the lower wall parts 42A. The lower case 42 is hollow boxy with the lower wall parts 42A and the wall part integrally formed.

The casing 4 according to the present embodiment has the heat-discharge structure 43 as a structure of removing condensing heat that may occur at an inner wall part 41A, and inhibits a rise in temperature due to focusing of the external light L2, resulting in inhibition of thermal degradation.

Specifically, the heat-discharge structure 43 is a structure of conducting heat from an inner wall part 41A to the corresponding lower wall part 42A to discharge the heat outward. The heat-discharge structure 43 typically causes condensing heat occurring at an inner wall part 41A to transfer to the corresponding lower wall part 42A, so that the heat is discharged outward.

The heat-discharge structure 43 according to the present embodiment includes a heat-transfer sheet 44. The heat-transfer sheet 44 is tabular (sheet-shaped) and is interposed between an inner wall part 41A and a lower wall part 42A in contact with the inner wall part 41A and the lower wall part 42A, which conducts heat from the inner wall part 41A to the lower wall part 42A. Provided are heat-transfer sheets 44 each interposed between the corresponding inner wall part 41A and the corresponding lower wall part 42A. That is, in the example of FIG. 2, provided are two heat-transfer sheets 44 in total, one of the two heat-transfer sheets 44 being interposed between one of the pair of inner wall parts 41A and the corresponding lower wall part 42A of the pair of lower wall parts 42A, the other heat-transfer sheet 44 being interposed between the other inner wall part 41A and the other lower wall part 42A.

Here, the inner case 41 and the lower case 42 are each formed of a material, such as a metallic material, having a relatively high thermal conductivity and having a relatively high heat resistance. For the heat-transfer sheets 44, for example, various publicly known heat-transfer sheets can be used, such as silicone-based, ceramic-based, acrylic-based, and carbon-fiber-based heat-transfer sheets. For each heat-transfer sheet 44, typically, used can be a heat-transfer sheet higher in thermal conductivity than air in order to promote thermal conduction between the inner wall part 41A and the lower wall part 42A. Herein, more preferably, the heat-transfer sheet is higher in thermal conductivity than the inner case 41 and the lower case 42.

The vehicular display device 1 described above causes the reflection portion 3 to reflect, to the windshield WS, the display light L1 that is emitted from the emitting portion 2 and is subjected to crossing in the direction intersecting the optical-axis direction. Then, with reflection of the display light L1 reflected to the windshield WS by the reflection portion 3, to the eye point EP by the windshield WS, the vehicular display device 1 can perform display with the display light L1 to the windshield WS. The vehicular display device 1 has the cross point CP at which crossing occurs in the display light L1, in the optical path between the emitting portion 2 and the reflection portion 3, so that the width of the optical path can be made relatively narrow in the vicinity of the cross point CP. As a result, the casing 4 can be rendered compact. In this case, the vehicular display device 1 has the cross point CP for the display light L1 located inside the inner case 41 housed in the lower case 42 in the casing 4, together with the focal area FA on which the external light L2 reflected from the reflection portion 3 after being incident on the reflection portion 3 from outside the casing 4 focuses.

The vehicular display device 1 having such a configuration conducts, through the heat-discharge structure 43 of the casing 4, heat from an inner wall part 41A facing the focal area FA in the inner case 41 to the lower wall part 42A located along the inner wall part 41A in the lower case 42, so that the heat can be discharged outward. Due to this configuration, the vehicular display device 1 enables conduction of condensing heat occurring at either inner wall part 41A facing the focal area FA to the corresponding lower wall part 42A through the heat-discharge structure 43, resulting in outward heat discharge. Thus, the vehicular display device 1 enables inhibition of a rise in the temperature of the casing 4 and additionally enables, for example, inhibition of heat from staying in the inner case 41. As a result, the vehicular display device 1 enables inhibition of thermal degradation with enhancement of the heat resistance of the casing 4. That is, the vehicular display device 1 is rendered compact and enables inhibition of thermal degradation as above, so that inhibition of an increase in size and inhibition of thermal degradation can be both achieved. Furthermore, the vehicular display device 1, accordingly, enables inhibition of thermal influence to other components.

Herein, the vehicular display device 1 described above has the heat-discharge structure 43 including the heat-transfer sheets 44 each interposed between the inner wall part 41A and the lower wall part 42A. Due to this configuration, the vehicular display device 1 enables promotion of heat transfer from the inner wall part 41A to the lower wall part 42A through each heat-transfer sheet 44. Thus, condensing heat occurring at either inner wall part 41A can be more efficiently conducted to the corresponding lower wall part 42A through the heat-discharge structure 43, resulting in outward heat discharge. As a result, the vehicular display device 1 enables reliable inhibition of a rise in the temperature of the casing 4, so that thermal degradation can be inhibited reliably.

Second Embodiment

A vehicular display device according to a second embodiment is different from that according to the first embodiment in terms of the configuration of a heat-discharge structure. In the following, constituent elements similar to those according to the embodiment described above are denoted with the same reference signs, and the duplicate descriptions of the same configurations, functions, and effects will be omitted as much as possible (the same applies hereinafter).

Figure 3:
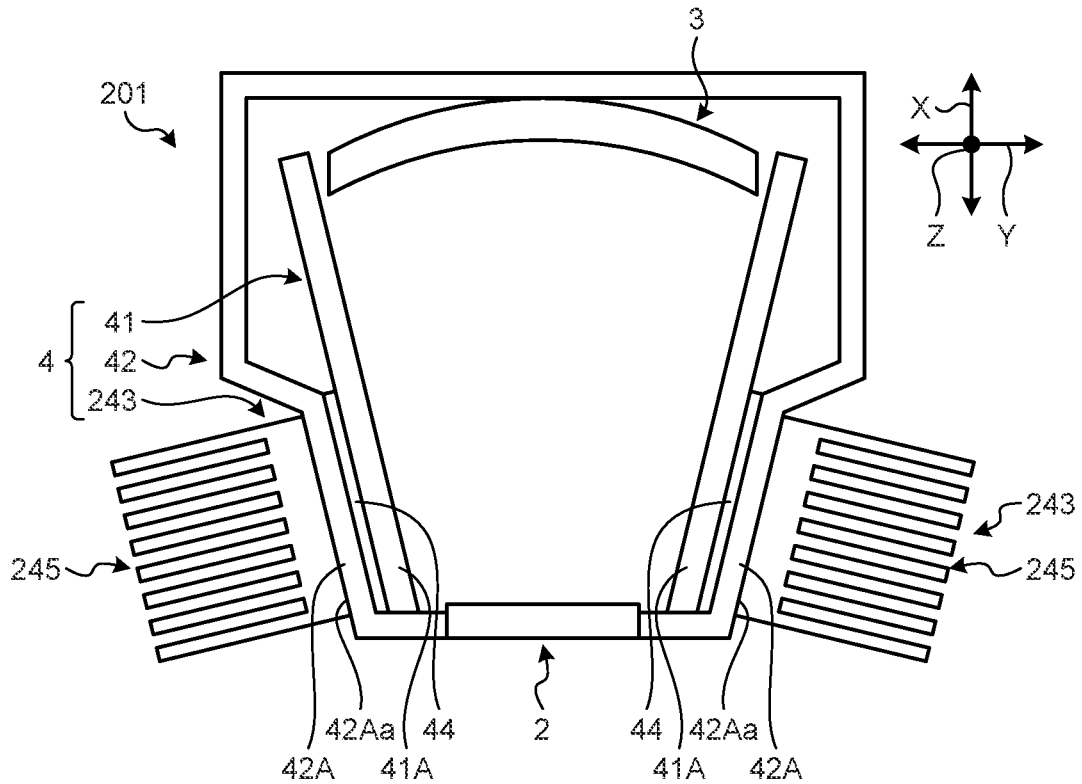
FIG. 3 is a schematic sectional view of a schematic configuration of a vehicular display device according to a second embodiment.

A vehicular display device 201 according to the present embodiment illustrated in FIG. 3 is different from the vehicular display device 1 described above in that the casing 4 has a heat-discharge structure 243 instead of the heat-discharge structure 43. The heat-discharge structure 243 is different from the heat-discharge structure 43 described above in that a heat sink portion 245 is provided in addition to the heat-transfer sheet 44. Except for the differences, the vehicular display device 201 and the heat-discharge structure 243 are substantially similar in configuration to the vehicular display device 1 and the heat-discharge structure 43 described above.

The heat sink portion 245 according to the present embodiment is a heat-dissipation mechanism of dissipating heat conducted from the inner wall part 41A to the lower wall part 42A outward, provided on an outer-wall surface 42Aa of the lower wall part 42A. In the example of FIG. 3, provided are the heat sink portions 245 corresponding one-to-one to the pair of lower wall parts 42A.

Here, the outer-wall surface 42Aa of the lower wall part 42A is a wall surface located on one side of the lower wall part 42A opposite to the other side closer to the inner wall part 41A. Herein, the outer-wall surface 42Aa is a wall surface opposite to the face in contact with the heat-transfer sheet 44.

The heat sink portions 245 are preferably relatively small in thermal resistance and are typically formed of a metallic material having a relatively high thermal conductivity. Herein, the heat sink portions 245 are each formed in a shape in which a relatively wide surface area (heat-dissipation area) is present due to a large number of heat-dissipation fins protruding from the outer-wall surface 42Aa of the lower wall part 42A. Due to this configuration, the heat sink portions 245 can dissipate heat efficiently.

Similarly to the vehicular display device 1 described above, the vehicular display device 201 described above enables inhibition of thermal degradation, so that inhibition of an increase in size and inhibition of thermal degradation can be both achieved.

Thus, the vehicular display device 201 described above has the heat-discharge structure 243 including the heat sink portions 245 each provided on the outer-wall surface 42Aa of the lower wall part 42A. Due to this configuration, the vehicular display device 201 enables more efficient outward dissipation of heat, such as condensing heat, conducted from either inner wall part 41A to the corresponding lower wall part 42A. As a result, the vehicular display device 201 enables more reliable inhibition of a rise in the temperature of the casing 4, so that thermal degradation can be more reliably inhibited.

Third Embodiment

A vehicular display device according to a third embodiment is different from those according to the first and second embodiments in terms of the configuration of a heat-discharge structure.

Figure 4:
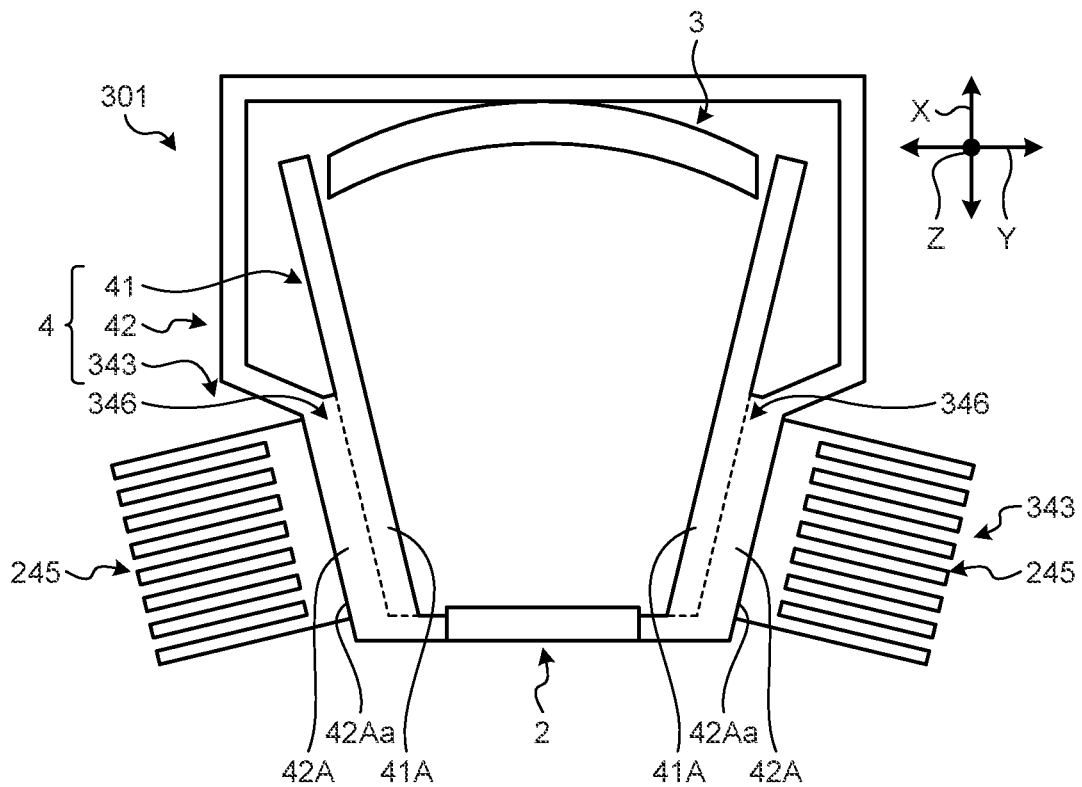
FIG. 4 is a schematic sectional view of a schematic configuration of a vehicular display device according to a third embodiment.

A vehicular display device 301 according to the present embodiment illustrated in FIG. 4 is different from the vehicular display device 201 described above in that the casing 4 has a heat-discharge structure 343 instead of the heat-discharge structure 243. The heat-discharge structure 343 is different from the heat-discharge structure 243 described above in that an integrally coupled portion 346 is provided instead of the heat-transfer sheet 44. Except for the differences, the vehicular display device 301 and the heat-discharge structure 343 are substantially similar in configuration to the vehicular display device 201 and the heat-discharge structure 243 described above.

The integrally coupled portion 346 according to the present embodiment includes the inner wall part 41A and the lower wall part 42A integrally coupled together. The integrally coupled portion 346 of the heat-discharge structure 343 may result from integral molding of the inner wall part 41A and the lower wall part 42A (namely, integral molding of the inner case 41 and the lower case 42).

Alternately, the integrally coupled portion 346 of the heat-discharge structure 343 may result from, for example, welding coupling of the individually formed inner wall part 41A and the individually formed lower wall part 42A. Also, the integrally coupled portion 346 of the heat-discharge structure 343 may result from bolt fastening of the individually formed inner wall part 41A and the individually formed lower wall part 42A in contact with each other.

Similarly to the vehicular display devices 1 and 201 described above, the vehicular display device 301 described above enables inhibition of thermal degradation, so that inhibition of an increase in size and inhibition of thermal degradation can be both achieved.

Thus, the vehicular display device 301 described above has the heat-discharge structure 343 including the integrally coupled portion 346. Due to this configuration, the vehicular display device 301 enables inhibition of thermal resistance at the time of heat transfer from the inner wall part 41A to the lower wall part 42A in the integrally coupled portion 346. Thus, heat, such as condensing heat, can be more efficiently conducted to the lower wall part 42A through the heat-discharge structure 343, resulting in outward heat discharge. As a result, the vehicular display device 301 enables reliable inhibition of a rise in the temperature of the casing 4, so that thermal degradation can be inhibited reliably.

Fourth Embodiment

A vehicular display device according to a fourth embodiment is different from those according to the first, second, and third embodiments in that a forced air cooling portion is provided.

Figure 5:
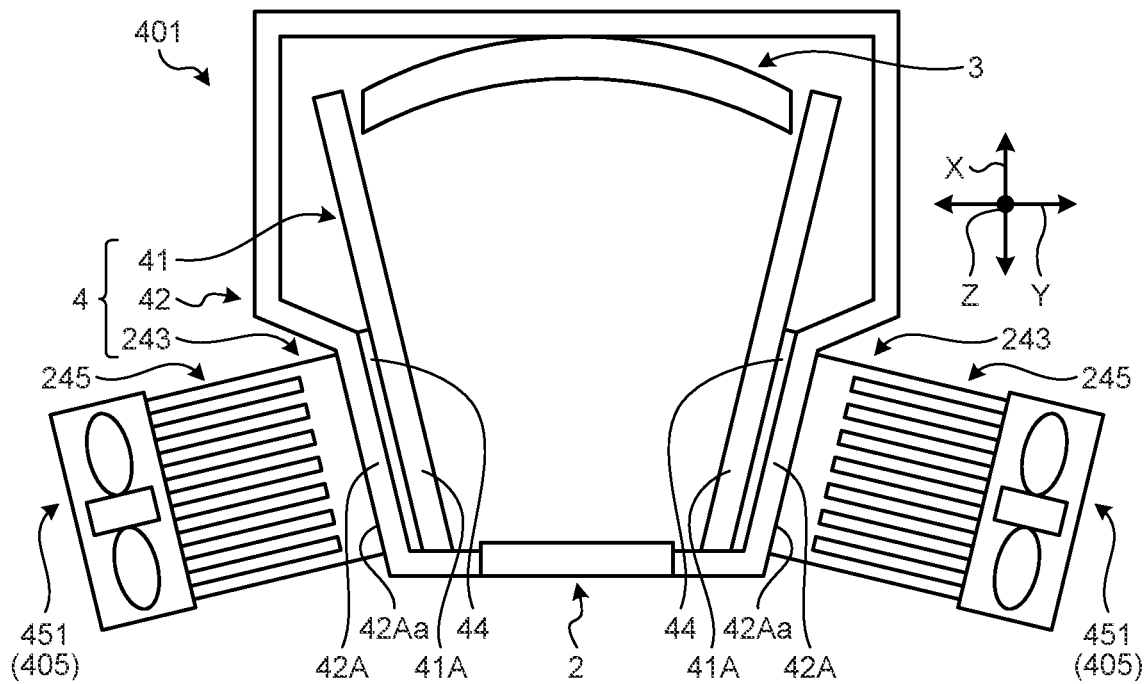
FIG. 5 is a schematic sectional view of a schematic configuration of a vehicular display device according to a fourth embodiment.

A vehicular display device 401 according to the present embodiment illustrated in FIG. 5 is different from the vehicular display device 201 described above in that a forced air cooling portion 405 is provided. Except for the difference, the vehicular display device 401 is substantially similar in configuration to the vehicular display device 201 described above.

Specifically, the forced air cooling portion 405 forcibly cools the heat sink portion 245 with cooling air. The forced air cooling portion 405 includes, for example, a cooling fan 451 that generates cooling air with an impeller in rotary motion. In the example of FIG. 5, provided are the cooling fans 451 corresponding one-to-one to the pair of heat sink portions 245.

The cooling fans 451 are each provided so as to blow cooling air to the corresponding heat sink portion 245 from one side opposite to the other side closer to the lower wall part 42A. The cooling fans 451 each blow, to the corresponding heat sink portion 245, cooling air generated by the impeller in rotary motion, so that the heat sink portion 245 is forcibly cooled.

Similarly to the vehicular display devices 1, 201, and 301 described above, the vehicular display device 401 described above enables inhibition of thermal degradation, so that inhibition of an increase in size and inhibition of thermal degradation can be both achieved.

Thus, for the vehicular display device 401 described above, each cooling fan 451 included in the forced air cooling portion 405 forcibly cools the heat sink portion 245, so that heat, such as condensing heat, conducted from either inner wall part 41A to the corresponding lower wall part 42A can be more efficiently dissipated outward. As a result, the vehicular display device 401 enables more reliable inhibition of a rise in the temperature of the casing 4, so that thermal degradation can be more reliably inhibited.

It should be noted that, in the above description, the forced air cooling portion 405 including the cooling fans 451 has been given, but this configuration is not limitative.

Figure 6:
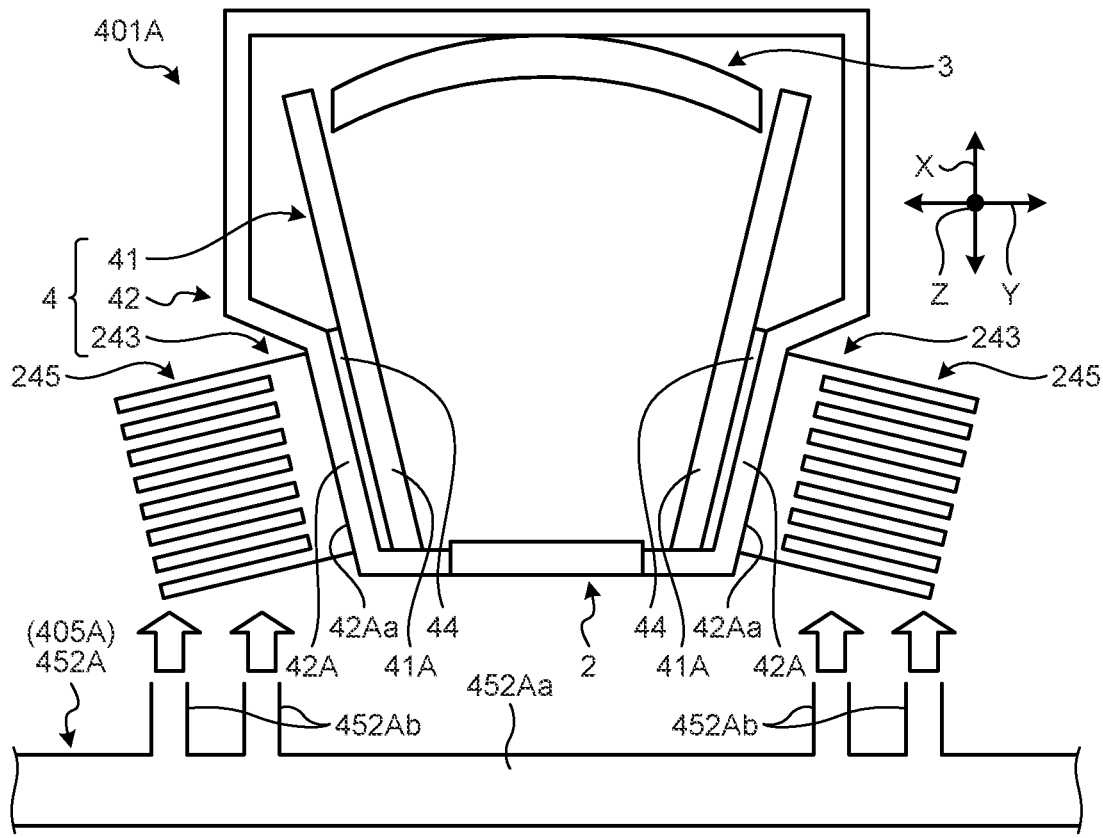
FIG. 6 is a schematic sectional view of a schematic configuration of a vehicular display device according to a modification.

A vehicular display device 401A according to a modification illustrated in FIG. 6 is different from the vehicular display device 401 described above in that a forced air cooling portion 405A is provided instead of the forced air cooling portion 405. Except for the difference, the vehicular display device 401A is substantially similar in configuration to the vehicular display device 401 described above.

The forced air cooling portion 405A illustrated in FIG. 6 is similar to the forced air cooling portion 405 described above in that the heat sink portion 245 is cooled forcibly by cooling air. The forced air cooling portion 405A according to the present modification is different from the forced air cooling portion 405 in terms of the source of cooling air.

The forced air cooling portion 405A according to the present modification is achieved by dual use of an air conditioner 452A equipped in the vehicle V. The air conditioner 452A sends cooling air into the room of the vehicle V to cool the room, and includes a duct 452Aa and a nozzle 452Ab. The duct 452Aa is a laying pipe through which cooling air for cooling the room flows. The nozzle 452Ab is an outlet for blowing the cooling air flowing in the duct 452Aa, outward, and is provided such that the cooling air can be blown to each heat sink portion 245. The forced air cooling portion 405A blows part of the cooling air for cooling the room flowing in the duct 452Aa, to each heat sink portion 245 through the nozzle 452Ab, so that each heat sink portion 245 is forcibly cooled.

Even for the vehicular display device 401A as above, the air conditioner 452A serving as the forced air cooling portion 405A forcibly cools the heat sink portions 245, so that heat, such as condensing heat, conducted from either inner wall part 41A to the corresponding lower wall part 42A can be more efficiently dissipated outward. As a result, similarly to the vehicular display device 401, the vehicular display device 401A enables more reliable inhibition of a rise in the temperature of the casing 4, so that thermal degradation can be more reliably inhibited.

Furthermore, instead of the forced air cooling portions 405 and 405A as above, for example, provided may be a forced air cooling portion that forcibly cools each heat sink portion 245 with the wind of the traveling vehicle V as cooling air.

Fifth Embodiment

A vehicular display device according to a fifth embodiment is different from those according to the first, second, third, and fourth embodiments in that a temperature detector and a controller are provided.

Figure 7:
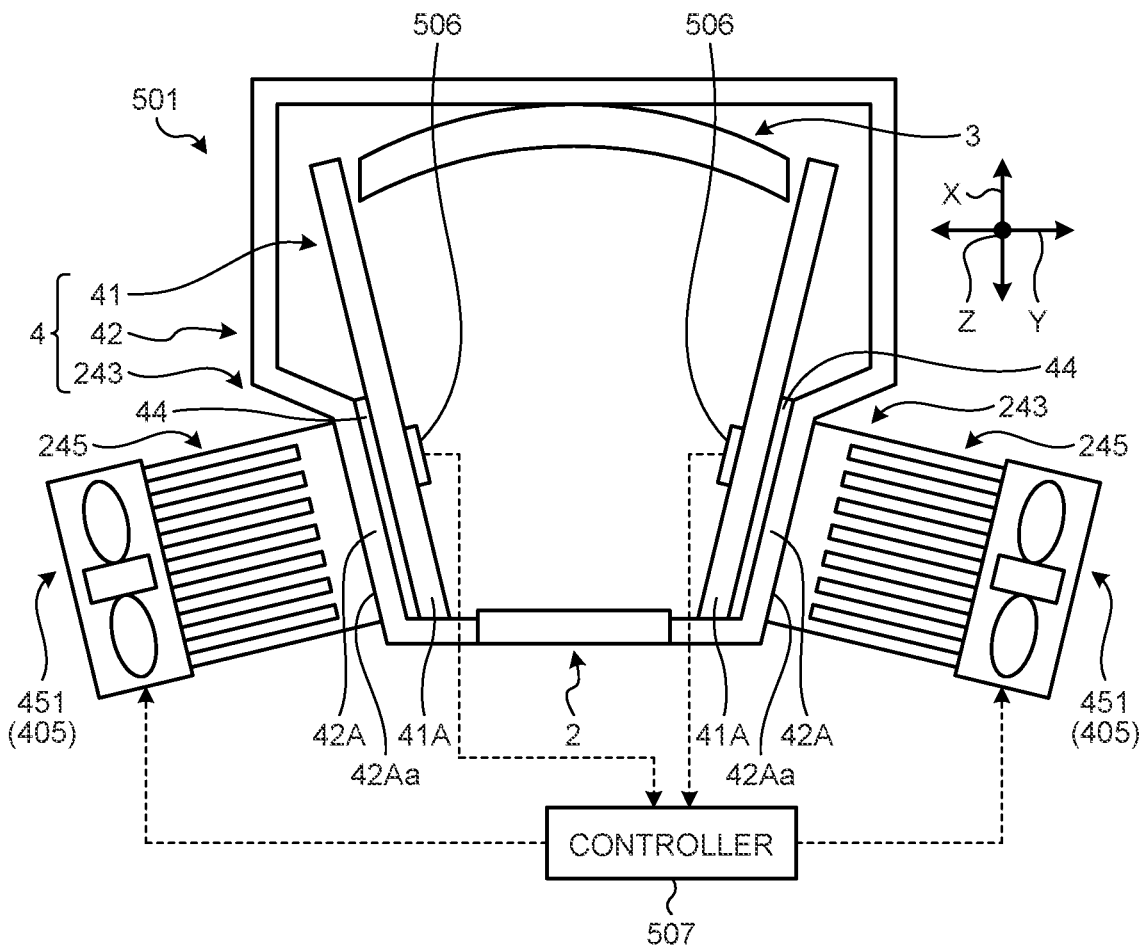
FIG. 7 is a schematic sectional view of a schematic configuration of a vehicular display device according to a fifth embodiment.

A vehicular display device 501 according to the present embodiment illustrated in FIG. 7 is different from the vehicular display device 401 described above in that a temperature detector 506 and a controller 507 are provided. Except for the difference, the vehicular display device 501 is substantially similar in configuration to the vehicular display device 401 described above.

Specifically, the temperature detector 506 detects the temperature of the inner wall part 41A. The temperature detector 506 includes, for example, a thermistor. The temperature detector 506 is provided, for example, in a focal area FA as described above or in the vicinity of the focal area FA, on the inner wall part 41A, and detects, for example, a rise in the temperature of the inner wall part 41A due to condensing heat. In the example of FIG. 7, provided are the temperature detectors 506 corresponding one-to-one to the pair of inner wall parts 41A. Each temperature detector 506 outputs, to the controller 507, a detection signal indicating the detected temperature of the inner wall part 41A.

On the basis of the temperature of the inner wall part 41A detected by each temperature detector 506, the controller 507 controls the drive of the forced air cooling portion 405. The controller 507 includes an electronic circuit mainly including a well-known microcomputer including a central processor, such as a CPU, a ROM, a RAM, and an interface, for example. The controller 507 is electrically connected to the temperature detectors 506 and the forced air cooling portion 405, so that various signals can be mutually transmitted and received. The controller 507 may be achieved, for example, by dual use of a control device that controls, in a centralized manner, the operation of each part in the vehicular display device 501 including the emitting portion 2 and the like, or by dual use of a vehicular ECU and the like that controls, in a centralized manner, each part in a vehicle V. Alternatively, the controller 507 may be provided separately from the control device and the vehicular ECU.

The controller 507 according to the present embodiment brings, in a case where the temperature of the inner wall part 41A detected by the temperature detector 506 is a previously set temperature threshold or more, the forced air cooling portion 405 into the driving state. Meanwhile, the controller 507 brings, in a case where the temperature of the inner wall part 41A detected by the temperature detector 506 is less than the previously set temperature threshold, the forced air cooling portion 405 into the stopped state. Herein, for example, the controller 507 brings, in a case where the temperature of either inner wall part 41A detected by the plurality of temperature detectors 506 is the temperature threshold or more, the forced air cooling portion 405 into the driving state. Alternatively, the controller 507 brings, in a case where the temperatures of both of the inner wall parts 41A detected by the plurality of temperature detectors 506 are less than the temperature threshold, the forced air cooling portion 405 into the stopped state.

Here, the temperature threshold is a threshold set to the temperature of each inner wall part 41A and is set in advance, for example, in consideration of the heat resistance of each inner wall part 41A. The driving state of the forced air cooling portion 405 is a state where the heat sink portion 245 is forcibly cooled by blowing of cooling air to the heat sink portion 245 due to the drive of the forced air cooling portion 405. Meanwhile, the stopped state of the forced air cooling portion 405 is a state where the forced cooling to the heat sink portion 245 is stopped with the forced air cooling portion 405 stopped.

Figure 8:
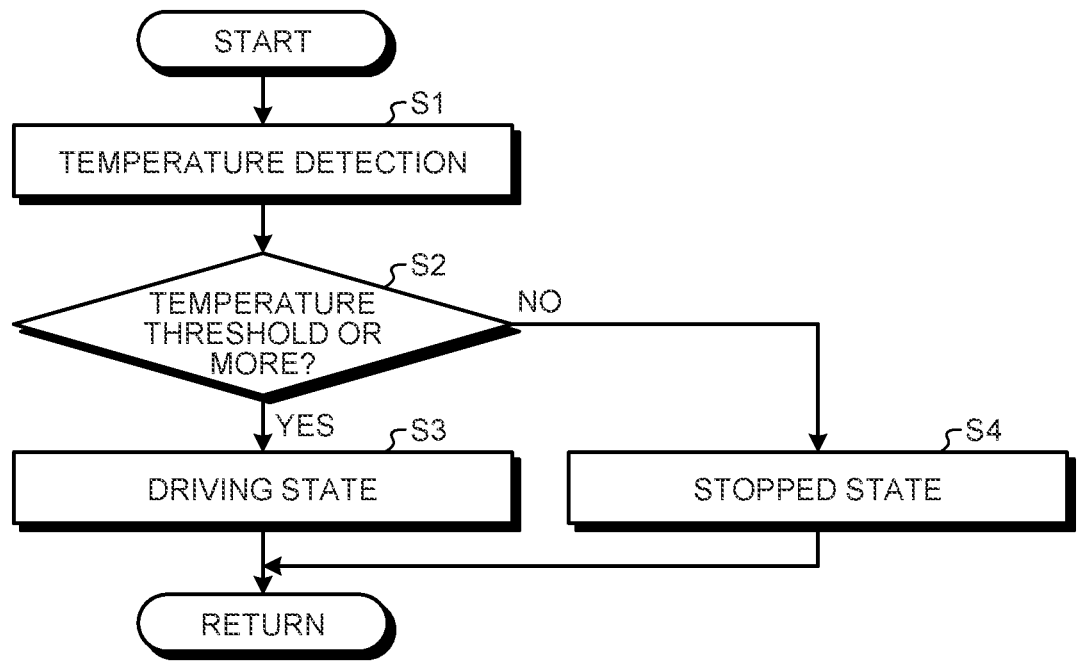
FIG. 8 is an explanatory flowchart of exemplary control of the vehicular display device according to the fifth embodiment.

Next, exemplary control in the vehicular display device 501 will be described with reference to the flowchart of FIG. 8. It should be noted that the control routine is repeatedly performed, for example, at every control cycle of several milliseconds or several tens of milliseconds (clock unit).

First, each temperature detector 506 detects the temperature of the inner wall part 41A and transmits a detection signal indicating the detected temperature of the inner wall part 41A to the controller 507 (Step S1).

After receiving the detection signal from each temperature detector 506, the controller 507 determines whether or not the detected temperature of the inner wall part 41A is the previously set temperature threshold or more (Step S2).

In a case where it is determined that the temperature of either inner wall part 41A detected by the plurality of temperature detectors 506 is the temperature threshold or more (Step S2: Yes), the controller 507 brings the forced air cooling portion 405 into the driving state (Step S3). Then, this control cycle finishes, resulting in transition to the next control cycle.

In a case where it is determined that the temperatures of both of the inner wall parts 41A detected by the plurality of temperature detectors 506 are less than the temperature threshold (Step S2: No), the controller 507 brings the forced air cooling portion 405 into the stopped state (Step S4). Then, this control cycle finishes, resulting in transition to the next control cycle.

Similarly to the vehicular display devices 1, 201, 301, and 401 described above, the vehicular display device 501 described above enables inhibition of thermal degradation, so that inhibition of an increase in size and inhibition of thermal degradation can be both achieved.

Furthermore, similarly to the vehicular display device 401 described above, for the vehicular display device 501 described above, the forced air cooling portion 405 forcibly cools the heat sink portions 245, so that heat, such as condensing heat, conducted from either inner wall part 41A to the corresponding lower wall part 42A can be more efficiently dissipated outward.

Thus, for the vehicular display device 501 described above, the controller 507 selectively switches the operation state of the forced air cooling portion 405, on the basis of the temperature of the inner wall part 41A detected by each temperature detector 506. Thus, for the vehicular display device 501, in a case where the temperature of either inner wall part 41A is relatively high and the inner wall part 41A requires active cooling, the forced air cooling portion 405 can be brought into the driving state. Meanwhile, in a case where the temperatures of the inner wall parts 41A are relatively low, the forced air cooling portion 405 can be brought into the stopped state. As a result, the vehicular display device 501 enables inhibition of power consumption with more reliable inhibition of thermal degradation due to more reliable inhibition of a rise in the temperature of the casing 4.

It should be noted that, in the above description, the temperature detectors 506 each including, for example, the thermistor, have been given, but this configuration is not limitative.

Figure 9:
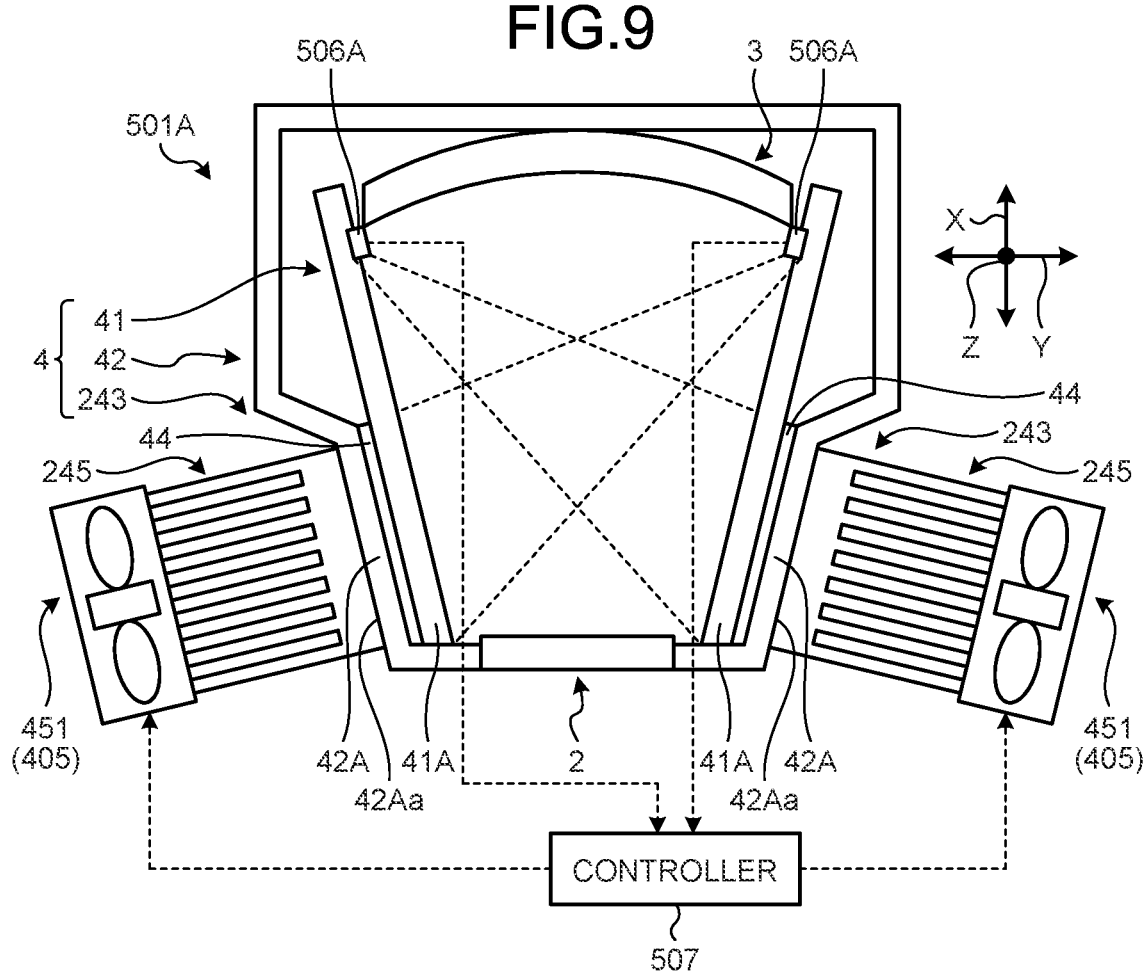
FIG. 9 is a schematic sectional view of a schematic configuration of a vehicular display device according to a modification.

A vehicular display device 501A according to a modification illustrated in FIG. 9 is different from the vehicular display device 501 described above in that a temperature detector 506A is provided instead of the temperature detector 506. Except for the difference, the vehicular display device 501A is substantially similar in configuration to the vehicular display device 501 described above.

The temperature detectors 506A illustrated in FIG. 9 are similar to the temperature detectors 506 described above in that each detects the temperature of the inner wall part 41A. The temperature detectors 506A according to the present modification are different from the temperature detectors 506 in that the temperature detectors 506A each include an infrared sensor instead of a thermistor. In the example of FIG. 9, in the vicinity of a reflection portion 3, provided are the temperature detectors 506A corresponding one-to-one to the pair of inner wall parts 41A. The temperature detectors 506A each detect the temperature in a focal area FA as described above or in the vicinity of the focal area FA, on the inner wall part 41A.

On the basis of the temperature of the inner wall part 41A detected by each temperature detector 506A, a controller 507 controls the drive of the forced air cooling portion 405, similarly to the above.

Similarly to the vehicular display device 501, even for the vehicular display device 501A as above, power consumption can be inhibited with more reliable inhibition of thermal degradation due to more reliable inhibition of a rise in the temperature of the casing 4.

Sixth Embodiment

A vehicular display device according to a sixth embodiment is different from those according to the first, second, third, fourth, and fifth embodiments in terms of the configuration of a heat-discharge structure.

Figure 10:
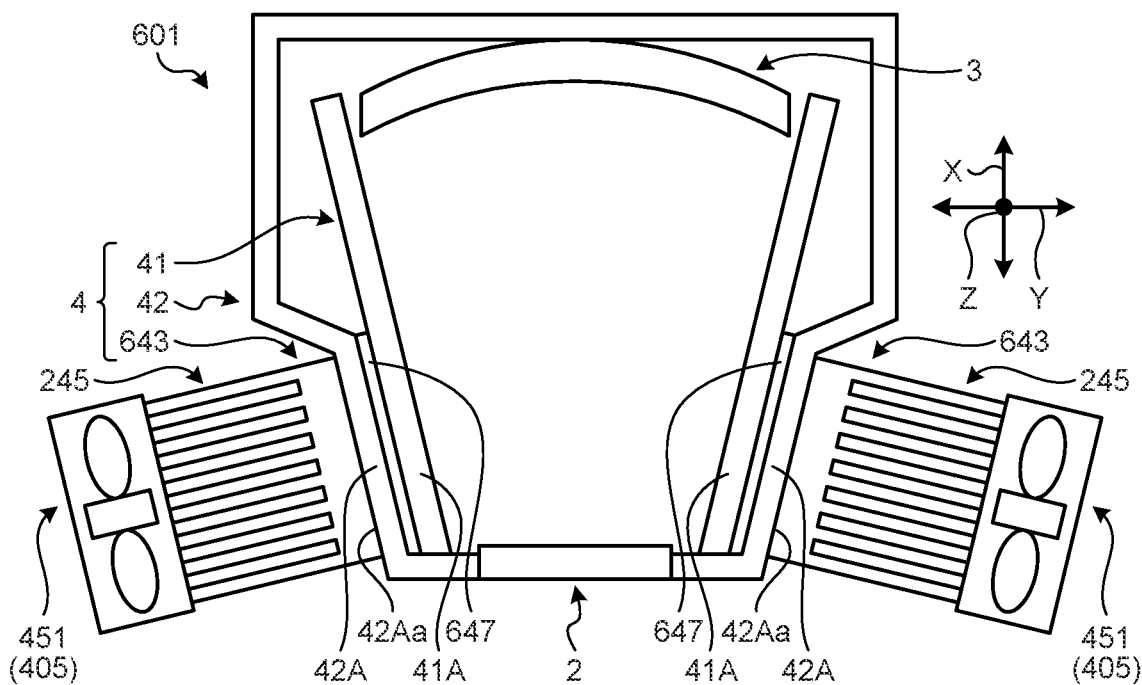
FIG. 10 is a schematic sectional view of a schematic configuration of a vehicular display device according to a sixth embodiment.

A vehicular display device 601 according to the present embodiment illustrated in FIG. 10 is different from the vehicular display device 401 described above in that the casing 4 has a heat-discharge structure 643 instead of the heat-discharge structure 243. The heat-discharge structure 643 is different from the heat-discharge structure 243 described above in that a Peltier element 647 is provided instead of the heat-transfer sheet 44. Except for the differences, the vehicular display device 601 and the heat-discharge structure 643 are substantially similar in configuration to the vehicular display device 401 and the heat-discharge structure 243 described above.

The Peltier element 647 according to the present embodiment achieves Peltier effect due to application of a direct current. For example, the Peltier element 647 is a tabular thermoelectric cooling semiconductor element having an effect of heat transfer, with a flow of direct current through the junction between two types of metals, from one of the metals to the other. The Peltier element 647 has one face on which heat absorption occurs and the other face on which heat generation occurs.

The Peltier element 647 according to the present embodiment is interposed between the inner wall part 41A and the lower wall part 42A in contact with the inner wall part 41A and the lower wall part 42A. Provided are Peltier elements 647 each interposed between the corresponding inner wall part 41A and the corresponding lower wall part 42A. That is, in the example of FIG. 10, provided are two Peltier elements 647 in total, one of the two Peltier elements 647 being interposed between one of the pair of inner wall parts 41A and the corresponding lower wall part 42A of the pair of lower wall parts 42A, the other Peltier element 647 being interposed between the other inner wall part 41A and the other lower wall part 42A. Due to application of a direct current, each Peltier element 647 according to the present embodiment performs heat absorption on the face in contact with the inner wall part 41A and performs heat generation on the face in contact with the lower wall part 42A.

Similarly to the vehicular display devices 1, 201, 301, 401, and 501 described above, the vehicular display device 601 described above enables inhibition of thermal degradation, so that inhibition of an increase in size and inhibition of thermal degradation can be both achieved.

Thus, the vehicular display device 601 described above has the heat-discharge structure 643 including the Peltier elements 647. Due to this configuration, the vehicular display device 601 enables more efficient heat transfer from the inner wall part 41A to the lower wall part 42A through each Peltier element 647. Thus, condensing heat or the like can be more efficiently conducted to the corresponding lower wall part 42A through the heat-discharge structure 643, resulting in outward heat discharge. As a result, the vehicular display device 601 enables more reliable inhibition of a rise in the temperature of the casing 4, so that thermal degradation can be more reliably inhibited.

It should be noted that a vehicular display device according to an embodiment of the present invention described above is not limited to the embodiments described above and thus various alternations can be made without departing from the scope of the claims. The vehicular display device according to the present embodiment may be achieved by any appropriate combination of the constituent elements according to the embodiments and modifications described above.

In the above description, for example, given has been the vehicular display device 1 that causes, in the display light L1, crossing in both of the vehicular width direction Y and the vehicular height direction Z as the direction intersecting the optical-axis direction before the display light L1 emitted from the emitting portion 2 reaches the reflection portion 3. However, crossing may be caused in either the vehicular width direction Y or the vehicular height direction Z.

In the above description, given have been the inner case 41 and the lower case 42 each formed of a metallic material having a relatively high thermal conductivity and having a relatively high heat resistance. However, this configuration is not limitative, and thus the inner case 41 and the lower case 42 may be each formed of a resin material having such performances.

In the above description, given have been the temperature detectors 506 or the temperature detectors 506A that are provided corresponding one-to-one to the pair of inner wall parts 41A. However, this configuration is not limitative, and thus the temperature detector 506 or 506A may be provided to either inner wall part 41A.

Given has been the windshield WS serving as the display surface that reflects the display light L1 reflected from the reflection portion 3, to the eye point EP. However, this configuration is not limitative, and thus, for example, a combiner provided separately from the windshield WS may serve as the display surface.

A vehicular display device according to the present embodiment causes a reflection portion to reflect, to a display surface, display light that is emitted from an emitting portion and is subjected to crossing in the direction intersecting an optical-axis direction. Then, with reflection of the display light reflected to the display surface by the reflection portion, to an eye point by the display surface, the vehicular display device can perform display with the display light to the display surface. In this case, the vehicular display device has a cross point for the display light located inside an inner case housed in a lower case in a casing, together with a focal area on which external light reflected from the reflection portion after being incident on the reflection portion from outside the casing focuses. The vehicular display device having such a configuration conducts, through the heat-discharge structure of the casing, heat from an inner wall part facing the focal area in the inner case to a lower wall part located along the inner wall part in the lower case, so that the heat can be discharged outward. Due to this configuration, the vehicular display device enables conduction of condensing heat occurring at the inner wall part facing the focal area to the lower wall part through the heat-discharge structure, resulting in outward heat discharge. As a result, the vehicular display device has an effect of inhibiting thermal degradation.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A vehicular display device comprising:
   an emitter equipped in a vehicle, the emitter being configured to emit display light;
   a reflector configured to reflect the display light that is emitted from the emitter and is subjected to crossing in a direction intersecting an optical-axis direction, to a display surface provided at the vehicle such that the display light is reflected from the display surface to a previously defined eye point; and
   a casing including an inner case inside which a cross point for the display light is located and a lower case including a hollow internal space and housing the inner case inside the hollow internal space, wherein
   the inner case includes an inner wall part facing a focal area on which external light reflected from the reflector after being incident on the reflector from outside the casing focuses,
   the lower case includes a lower wall part located along the inner wall part,
   the casing has a heat-discharge structure of conducting heat from the inner wall part to the lower wall part to discharge the heat outward.

2. The vehicular display device according to claim 1, wherein
   the heat-discharge structure includes a heat-transfer sheet that is interposed between the inner wall part and the lower wall part in contact with the inner wall part and the lower wall part and conducts the heat from the inner wall part to the lower wall part.

3. The vehicular display device according to claim 1, wherein
   the heat-discharge structure includes an integrally coupled portion including the inner wall part and the lower wall part integrally coupled together.

4. The vehicular display device according to claim 1, wherein
the heat-discharge structure includes a Peltier element that is interposed between the inner wall part and the lower wall part in contact with the inner wall part and the lower wall part and achieves Peltier effect due to application of a direct current.

5. The vehicular display device according to claim 1, wherein
the heat-discharge structure includes a heat sink that is provided on an outer-wall surface of the lower wall part and dissipates the heat conducted from the inner wall part to the lower wall part, outward.

6. The vehicular display device according to claim 2, wherein
the heat-discharge structure includes a heat sink that is provided on an outer-wall surface of the lower wall part and dissipates the heat conducted from the inner wall part to the lower wall part, outward.

7. The vehicular display device according to claim 3, wherein
the heat-discharge structure includes a heat sink that is provided on an outer-wall surface of the lower wall part and dissipates the heat conducted from the inner wall part to the lower wall part, outward.

8. The vehicular display device according to claim 4, wherein
the heat-discharge structure includes a heat sink that is provided on an outer-wall surface of the lower wall part and dissipates the heat conducted from the inner wall part to the lower wall part, outward.

9. The vehicular display device according to claim 5, further comprising:
a forced air cooling structure configured to forcibly cool the heat sink with cooling air.

10. The vehicular display device according to claim 6, further comprising:
a forced air cooling structure configured to forcibly cool the heat sink with cooling air.

11. The vehicular display device according to claim 7, further comprising:
a forced air cooling structure configured to forcibly cool the heat sink with cooling air.

12. The vehicular display device according to claim 8, further comprising:
a forced air cooling structure configured to forcibly cool the heat sink with cooling air.

13. The vehicular display device according to claim 9, further comprising:
a temperature detector configured to detect a temperature of the inner wall part; and
a controller configured to control drive of the forced air cooling structure, based on the temperature of the inner wall part detected by the temperature detector, wherein
the controller brings, in a case where the temperature of the inner wall part detected by the temperature detector is a previously set temperature threshold or more, the forced air cooling structure into a driving state and brings, in a case where the temperature of the inner wall part detected by the temperature detector is less than the temperature threshold, the forced air cooling structure into a stopped state.

14. The vehicular display device according to claim 10, further comprising:
a temperature detector configured to detect a temperature of the inner wall part; and
a controller configured to control drive of the forced air cooling structure, based on the temperature of the inner wall part detected by the temperature detector, wherein
the controller brings, in a case where the temperature of the inner wall part detected by the temperature detector is a previously set temperature threshold or more, the forced air cooling structure into a driving state and brings, in a case where the temperature of the inner wall part detected by the temperature detector is less than the temperature threshold, the forced air cooling structure into a stopped state.

15. The vehicular display device according to claim 11, further comprising:
a temperature detector configured to detect a temperature of the inner wall part; and
a controller configured to control drive of the forced air cooling structure, based on the temperature of the inner wall part detected by the temperature detector, wherein
the controller brings, in a case where the temperature of the inner wall part detected by the temperature detector is a previously set temperature threshold or more, the forced air cooling structure into a driving state and brings, in a case where the temperature of the inner wall part detected by the temperature detector is less than the temperature threshold, the forced air cooling structure into a stopped state.

16. The vehicular display device according to claim 12, further comprising:
a temperature detector configured to detect a temperature of the inner wall part; and
a controller configured to control drive of the forced air cooling structure, based on the temperature of the inner wall part detected by the temperature detector, wherein
the controller brings, in a case where the temperature of the inner wall part detected by the temperature detector is a previously set temperature threshold or more, the forced air cooling structure into a driving state and brings, in a case where the temperature of the inner wall part detected by the temperature detector is less than the temperature threshold, the forced air cooling structure into a stopped state.

17. A vehicular display device comprising:
an emitter equipped in a vehicle, the emitter being configured to emit display light having an optical axis;
a reflector configured to reflect the display light that is emitted from the emitter, to a display surface provided at the vehicle such that the display light is reflected from the display surface to a previously defined eye point; and
a casing including an inner case inside which a cross point for the display light is located and a lower case housing the inner case inside, wherein the cross point corresponds to the focal point at which the display light emitted from the emitter converges between the emitter and the reflector, wherein
the inner case includes an inner wall part facing a focal area on which external light reflected from the reflector after being incident on the reflector from outside the casing focuses,
the lower case includes a lower wall part, the emitter abuts the lower wall part, the inner wall part abuts the lower wall part and extends away from the lower wall part and toward the reflector, and
the casing has a heat-discharge structure of conducting heat from the inner wall part to the lower wall part to discharge the heat outward.

* * * * *